(12) United States Patent
Voyer

(10) Patent No.: US 10,195,955 B2
(45) Date of Patent: Feb. 5, 2019

(54) SYSTEM AND METHOD FOR REDUCING THE ELECTRIC POWER CONSUMPTION OF RAILWAY SYSTEM

(71) Applicant: MITSUBISHI ELECTRIC CORPORATION, Tokyo (JP)

(72) Inventor: Nicolas Voyer, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/750,081

(22) PCT Filed: Aug. 31, 2016

(86) PCT No.: PCT/JP2016/003984
§ 371 (c)(1),
(2) Date: Feb. 2, 2018

(87) PCT Pub. No.: WO2017/056393
PCT Pub. Date: Apr. 6, 2017

(65) Prior Publication Data
US 2018/0222500 A1   Aug. 9, 2018

(30) Foreign Application Priority Data

Sep. 30, 2015   (EP) ..................................... 15187572

(51) Int. Cl.
*B60L 11/18* (2006.01)
*B60L 7/18* (2006.01)
(Continued)

(52) U.S. Cl.
CPC ............. *B60L 11/1842* (2013.01); *B60L 7/18* (2013.01); *B60L 9/00* (2013.01); *B60L 15/2009* (2013.01);
(Continued)

(58) Field of Classification Search
CPC .................................................. B60L 11/1842
See application file for complete search history.

(56) References Cited

U.S. PATENT DOCUMENTS

| 2011/0144831 A1 | 6/2011 | Hata |
| 2015/0008733 A1 | 1/2015 | Periot et al. |
| 2015/0027838 A1 | 1/2015 | Ueda et al. |

FOREIGN PATENT DOCUMENTS

| JP | 2015-168348 A | 9/2015 | |
| WO | WO 2005084335 A2 * | 9/2005 | ............... B60L 7/04 |

* cited by examiner

*Primary Examiner* — Daniel Cavallari
(74) *Attorney, Agent, or Firm* — Birch, Stewart, Kolasch & Birch, LLP

(57) ABSTRACT

The present invention concerns a method and system for reducing the electric power consumption of a railway system comprising at least one catenary, trains and at least one substation connected to sections of catenary and providing electric power to the catenary, wherein during the braking of the trains, the braking trains provide electric power to the catenary. The substation is associated to one device for reducing the electric power consumption and the invention:
- detects the presence of a braking train in one of the section connected to the substation,
- interrupts the electric power provided by the substation to the catenary if the presence of the braking train is detected,
- detects the absence of braking trains in each section connected to the substation,
- means for enabling the electric power to be provided by the substation to the catenary if the absence of braking trains is detected.

14 Claims, 8 Drawing Sheets

(51) Int. Cl.
*B60L 9/00* (2006.01)
*B60L 15/20* (2006.01)
*B60L 15/38* (2006.01)
*B61L 3/00* (2006.01)
*B60M 3/04* (2006.01)
*B60M 3/06* (2006.01)
*B61L 3/16* (2006.01)
*B61L 27/00* (2006.01)
*B61L 3/18* (2006.01)
*G01R 19/10* (2006.01)
*G01R 19/14* (2006.01)
*G01R 19/15* (2006.01)
*G01R 19/165* (2006.01)
*G01V 3/02* (2006.01)

(52) U.S. Cl.
CPC .......... *B60L 15/2045* (2013.01); *B60L 15/38* (2013.01); *B60M 3/04* (2013.01); *B60M 3/06* (2013.01); *B61L 3/006* (2013.01); *B61L 3/16* (2013.01); *B61L 3/18* (2013.01); *B61L 27/0027* (2013.01); *B61L 27/0077* (2013.01); *G01R 19/10* (2013.01); *G01R 19/14* (2013.01); *G01R 19/15* (2013.01); *G01R 19/165* (2013.01); *G01V 3/02* (2013.01); *B60L 2200/26* (2013.01); *B60L 2240/70* (2013.01); *Y02T 10/7283* (2013.01); *Y02T 10/7291* (2013.01); *Y02T 30/12* (2013.01); *Y02T 90/16* (2013.01)

[Fig. 1]
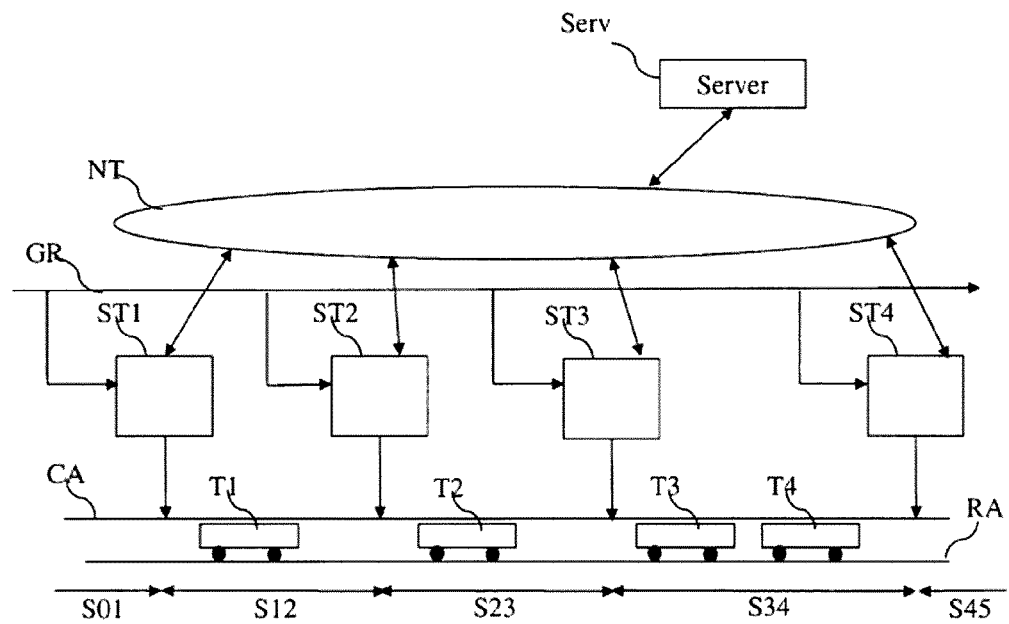
[Fig. 2A]
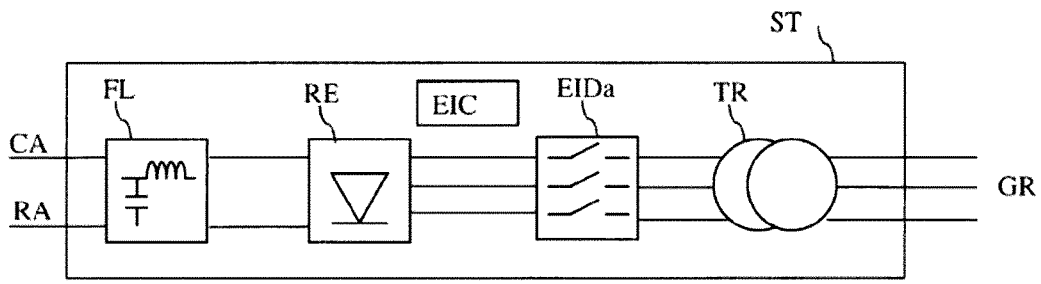
[Fig. 2B]
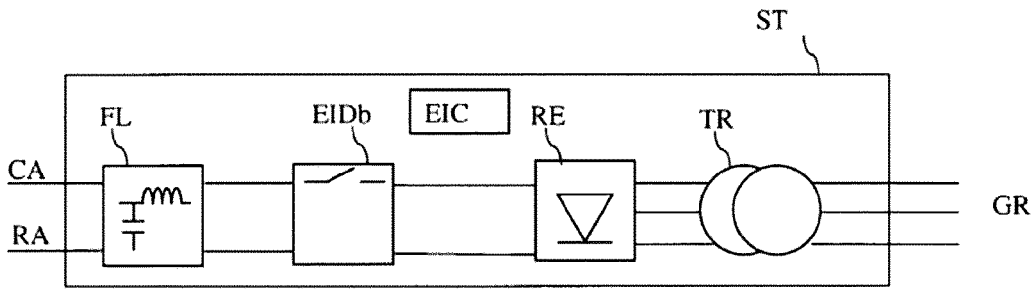

[Fig. 2C]
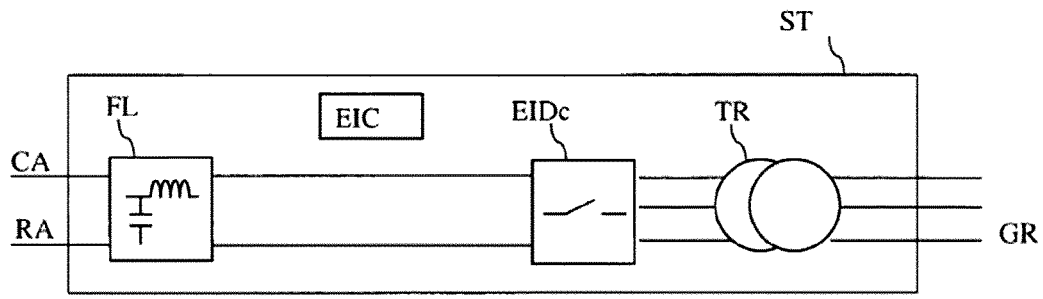
[Fig. 3]
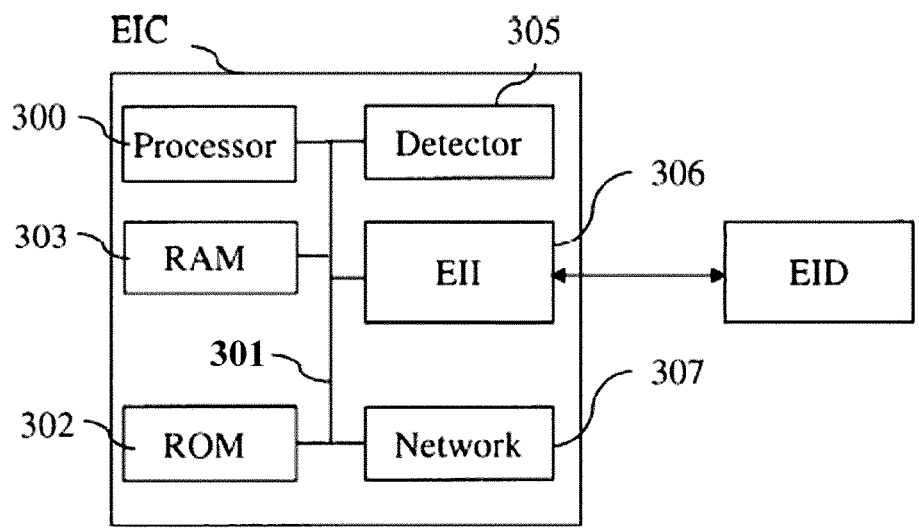
[Fig. 4]
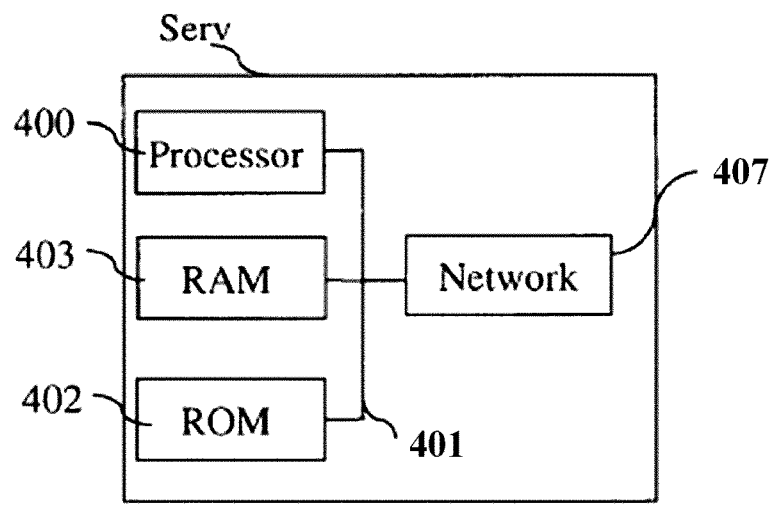

[Fig. 5A]
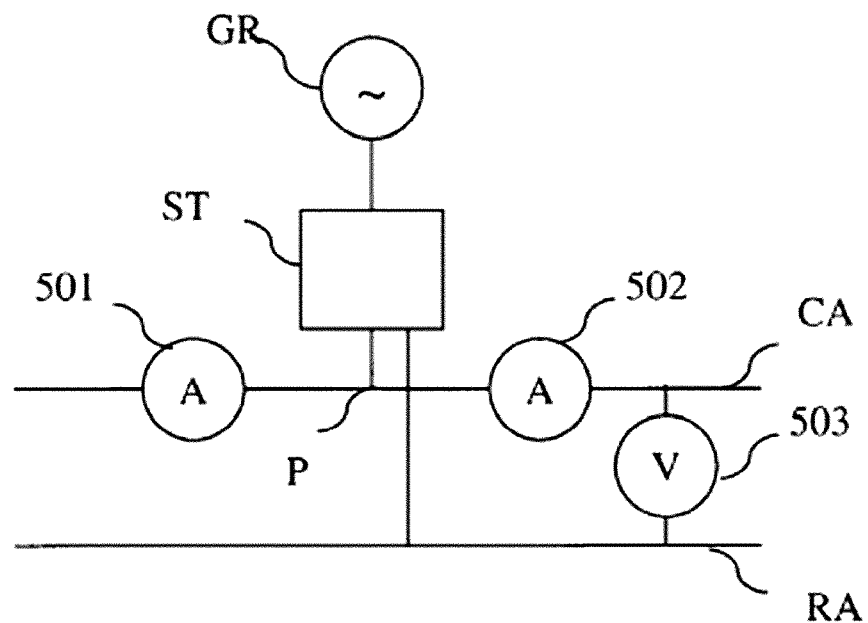
[Fig. 5B]
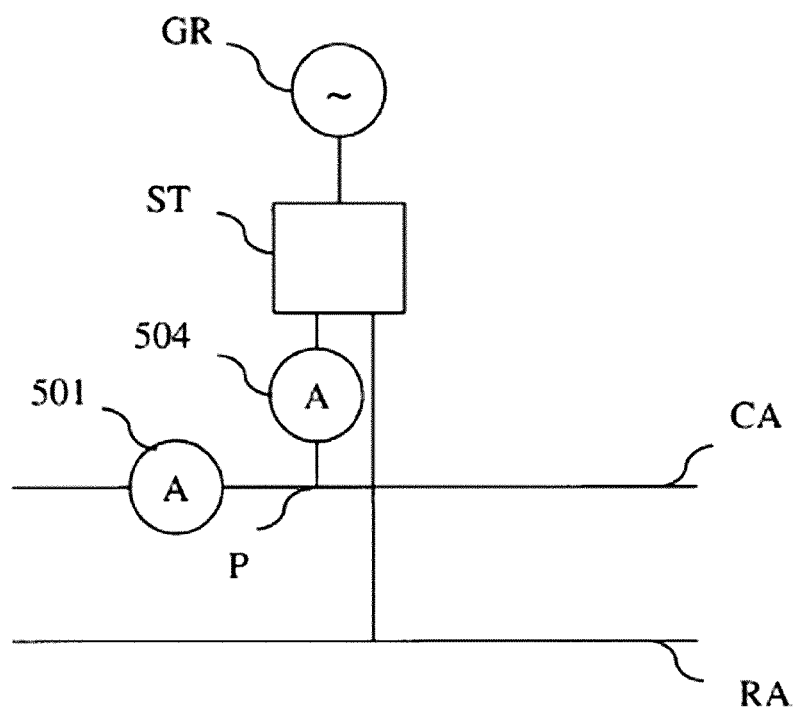

[Fig. 6]
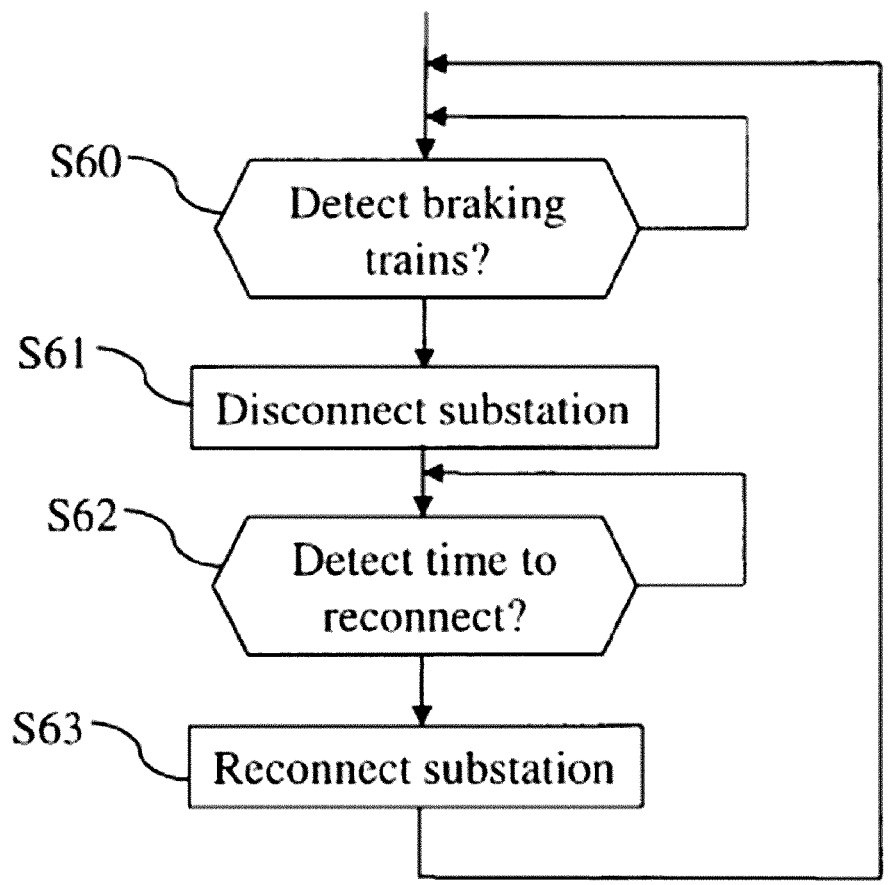

[Fig. 7]
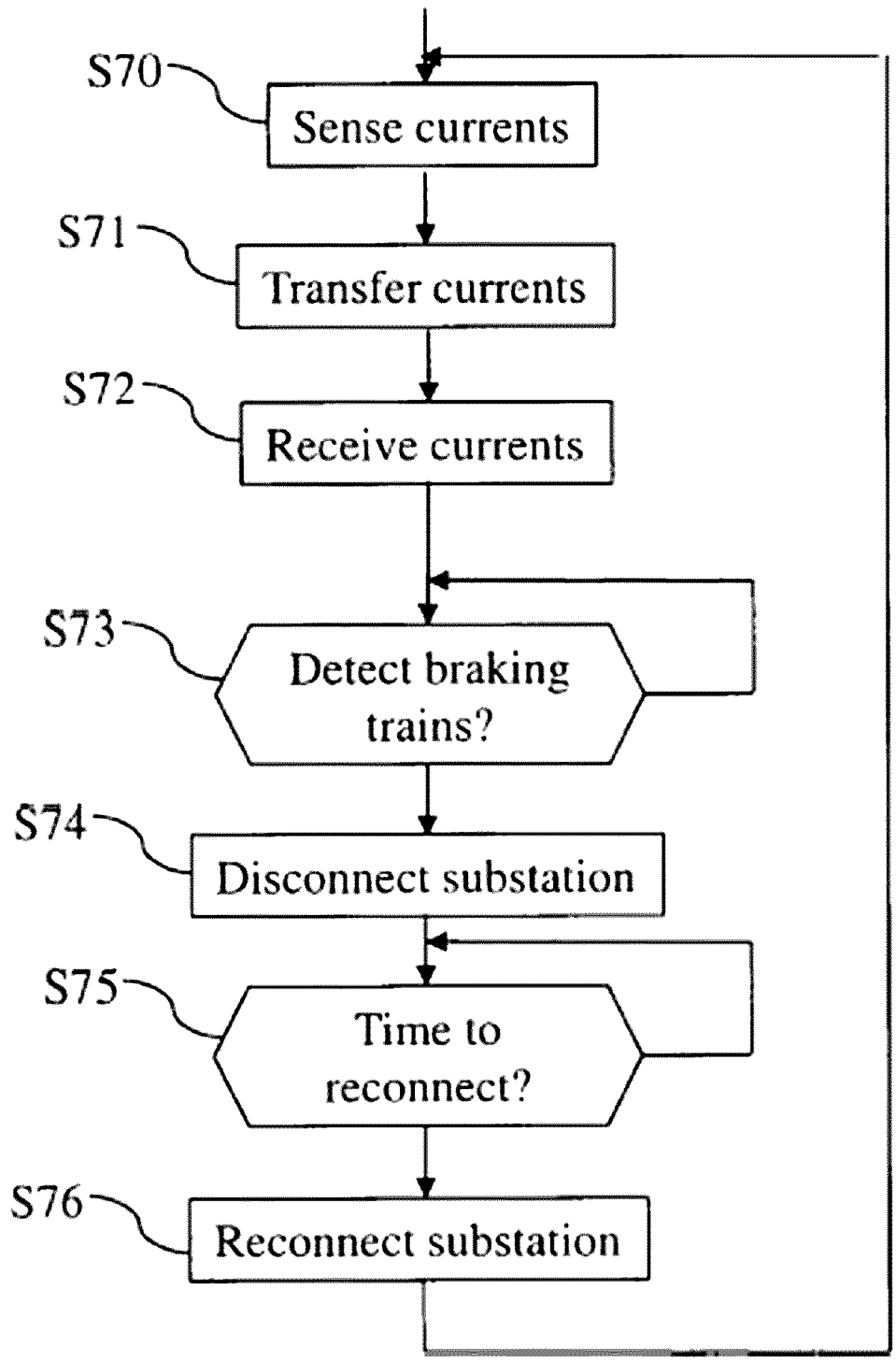

[Fig. 8A]
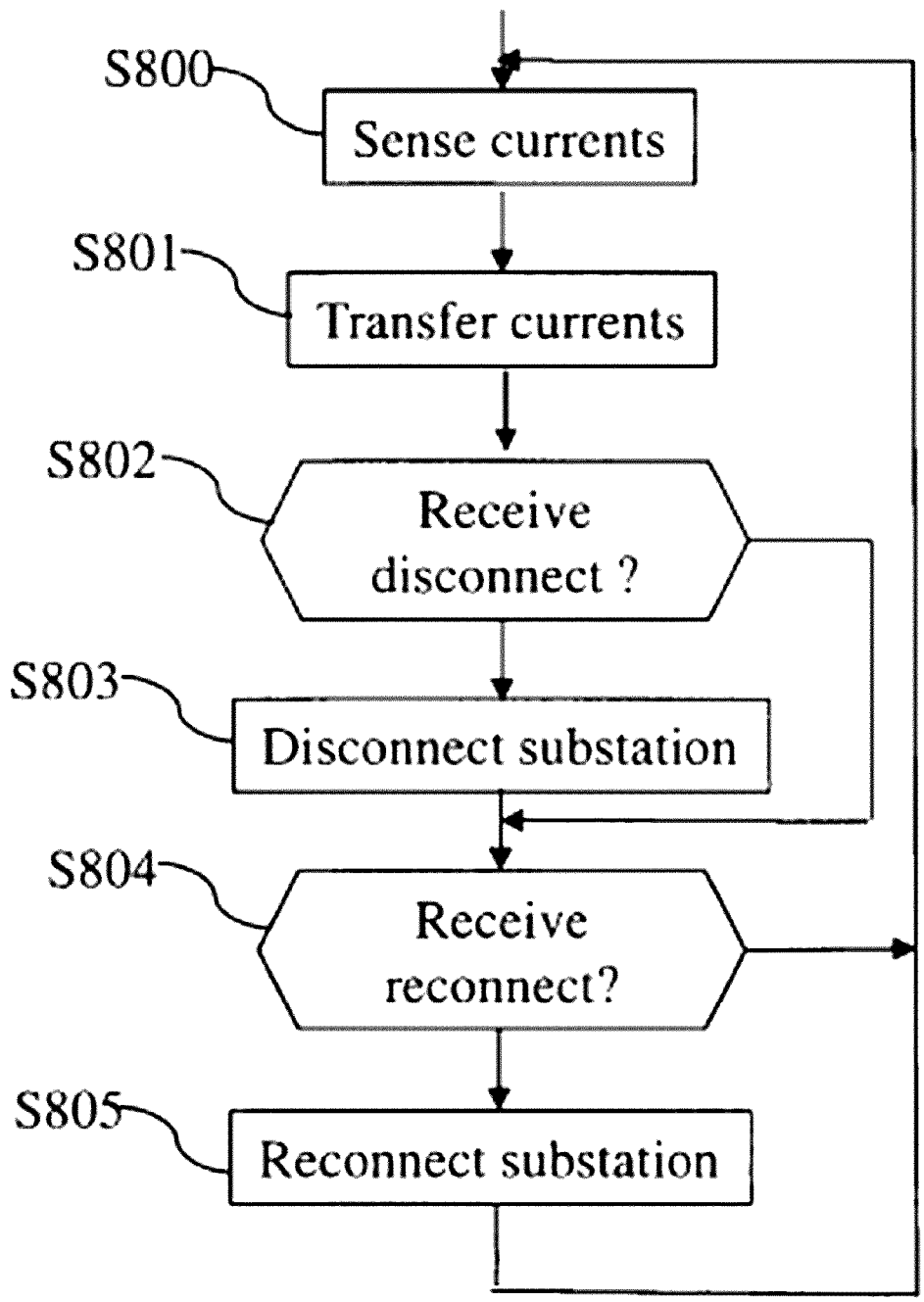

[Fig. 8B]
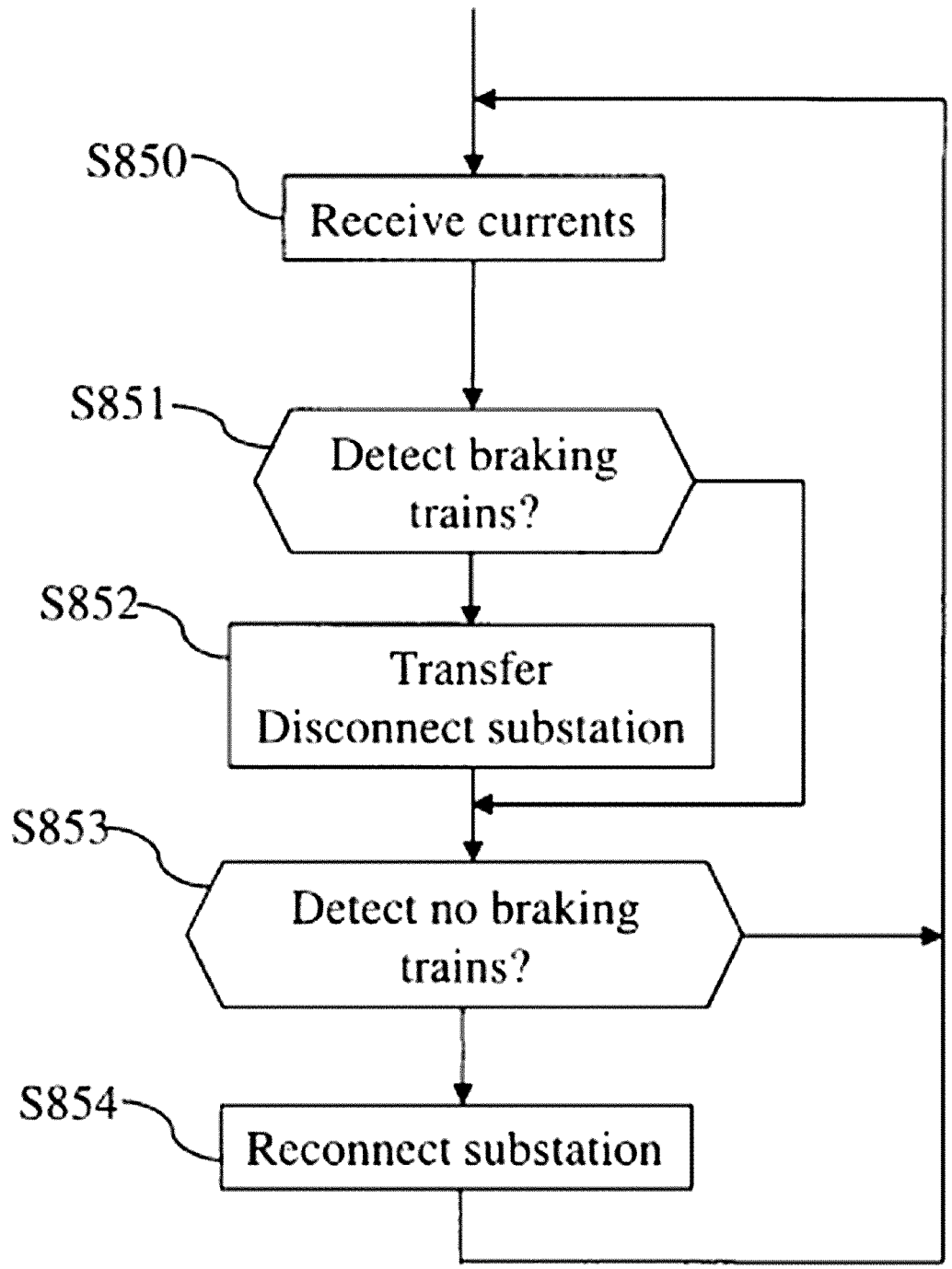

[Fig. 9]
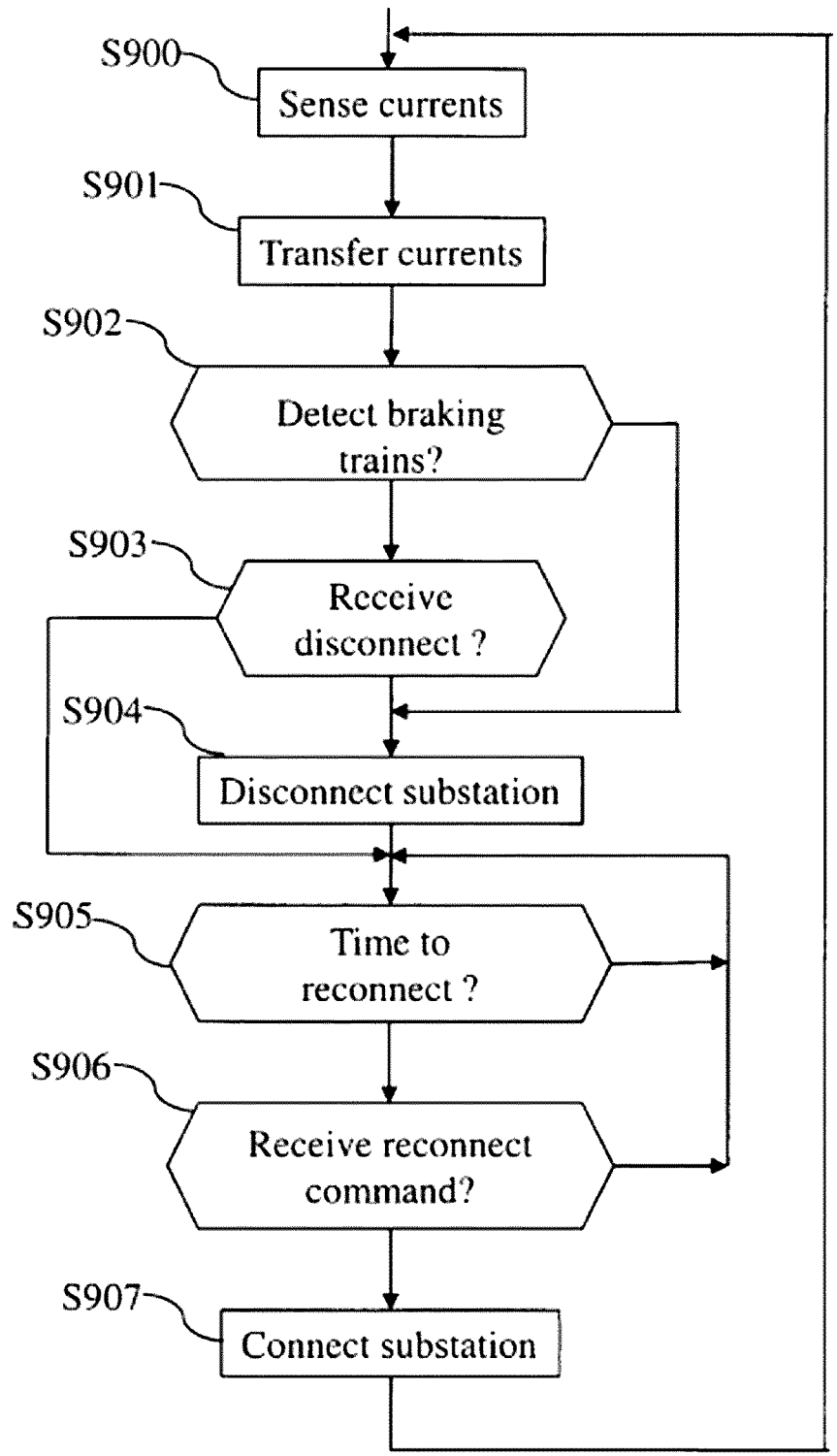

SYSTEM AND METHOD FOR REDUCING THE ELECTRIC POWER CONSUMPTION OF RAILWAY SYSTEM

TECHNICAL FIELD

The present invention relates generally to a method and a system for reducing the energy consumption of railway systems.

BACKGROUND ART

In electrified railway systems, the electric power needed by trains is supplied from the Grid to trains, using substations. Substations convert Grid electricity to catenary electricity which vehiculates electrical power to train pantographs.

The electrified railway system comprises a plurality of substations spaced along the railway line, typically by several kilometers from each other.

SUMMARY OF INVENTION

Technical Problem

When equipped with regeneration ability, trains can also convert part of their kinetic energy into electric power that may be fed back to the catenary. Due to ohmic losses in the catenary, the voltage on pantograph increases when electric power is fed back to the catenary.

To avoid dangerous overvoltages, trains with regeneration ability may also include rheostats. The level of electric power injected to the catenary and to the rheostats is adapted in order to keep a reasonable pantograph voltage. The braking current is squeezed, meaning that only a portion is actually fed to the catenary, the remaining portion being dissipated as heat in the rheostat.

When substations are mono-directional, they cannot convert catenary electricity back to the grid. This can cause significant amount of electric power wasted in rheostats.

The difference between braking powers and accelerating powers of all trains along the railway line may generate an excess of power, which must be dissipated in the rheostats of braking trains. To recover excess of power, solutions have been proposed such as reversible substations, that transfer the excess power back to the grid, or energy storage systems, which can absorb the excess power that will be later used when the sum of traction powers will exceed the sum of braking powers.

Even in presence of solutions for recovering excess brake energy, current squeezing can happen. Such case as example happens when a substation is hiding an accelerating train from a distant braking train. As the substation provides a part of acceleration power, it imposes a high voltage level to the distant braking train, which must squeeze a portion of its deceleration power, resulting in losses.

Solution to Problem

The present invention aims at providing a better use of the excess of electric power in an electric railway system where at least some substations of the electric railway system are not reversible.

To that end, the present invention concerns a method for reducing the electric power consumption of a railway system comprising at least one catenary, trains and at least one substation connected to sections of catenary and providing electric power to the catenary, wherein during the braking of the trains, the braking trains provide electric power to the catenary, characterized in that the substation is associated to one device for reducing the electric power consumption, and in that the method comprises the step of:

- detecting the presence of a braking train in one of the sections connected to the substation,
- interrupting the electric power provided by the substation to the catenary if the presence of the braking train in one of the sections connected to the substation is detected,
- detecting the absence of braking trains in each section connected to the substation,
- enabling the electric power to be provided by the substation to the catenary if the absence of braking trains in each section connected to the substation is detected and if the electric power provided by the substation is interrupted.

The present invention concerns also a system for reducing the electric power consumption of a railway system comprising at least one catenary, trains and at least one substation connected to sections of catenary and providing electric power to the catenary, wherein during the braking of the trains, the braking trains provide electric power to the catenary, characterized in that the substation is associated to one device for reducing the electric power consumption, and in that the system comprises:

- a first detector to detect the presence of a braking train in one of the sections connected to the substation,
- an interrupter to interrupt the electric power provided by the substation to the catenary if the presence of the braking train in one of the sections connected to the substation is detected,
- a second detector to detect the absence of braking trains in each section connected to the substation,
- enabling circuitry to enable the electric power to be provided by the substation to the catenary if the absence of braking trains in each section connected to the substation is detected and if the electric power provided by the substation is interrupted.

Thus, when a train is braking in a section connected to the substation, the substation no longer imposes a high voltage to the catenary. As a result, the voltage at the pantograph of the braking train is lowered, reducing the risk of current squeezing due to high voltage. The amount of regenerative energy injected to the catenary is higher, saving waste of braking energy into mechanical or rheostatic brakes.

According to a particular feature, the first detector detects the presence by sensing the current in each section connected to the substation and by checking if the currents flow in the same direction.

Thus, if currents flow in the same direction, a train from a first section provides current to a train in another section. The braking train is necessarily injecting current to the catenary and can be detected to be braking. The detection of a train braking in the vicinity of the substation does not rely on wireless communication between the train and the substation and is therefore very robust, including in tunnels. The substation can detect alone the presence of a braking train in a complete decentralised way.

According to a particular feature, the first detector detects the presence by sensing the current in one section connected to the substation and by sensing the current provided by the substation to the catenary.

Thus, the number of sensors sensing current of the catenary is minimised. Maintenance is simplified.

According to a particular feature, the first detector detects the presence by comparing the current time to a predetermined profile indicating the presence of braking trains in the time.

Thus, the systems requires no current sensing, therefore limiting losses due to current sensing. Installation of the system is easy, as catenary does not need to be isolated for the installation of sensors. In normal operation, trains are running in the railway line according to schedule, predetermined profile easily determines braking times and location.

According to a particular feature, the second detector detects the absence by comparing the time elapsed since the interrupting the electric power provided by the substation to the catenary to a predetermined value.

Thus, the substation can start delivering power to accelerating or coasting trains after the end of a braking period. The braking period is generally limited to few or tens of seconds. As substation enables the delivery of power to the catenary, accelerating trains can get sufficient acceleration to maintain its timeschedule. The delays are limited.

According to a particular feature, the second detector detects the absence by sensing the voltage at the connection of the catenary to the substation and by comparing the sensed voltage to a predetermined value.

Thus, a substation having interrupted the provision of electric power to the catenary can detect when an accelerating train is lacking electric power and its pantograph voltages get down. This situation indicates a supply shortage, likely caused by a lack of regeneration in the section, and substation can resume the delivery of power to the catenary.

According to a particular feature, the second detector detects the absence by sensing the current in one of the section connected to the substation and by checking if the sensed current is lower than a predetermined value.

Thus, a substation having interrupted the provision of electric power to the catenary can detect that the flow of current passing from one section to the other section is low. Because the substation has interrupted the provision of electric power, it is not cause for high pantograph voltage at the location of braking train, Therefore, the low level of current is merely caused by a reduction of braking power rather than by squeezing due to high voltage. As current is low, it may not be sufficient to feed enough power to surrounding trains in accelerating or coasting mode.

According to a particular feature, the second detector detects the absence by comparing the current time to a predetermined profile indicating the presence of braking trains in the time.

Thus, the systems requires no current or voltage sensing, therefore limiting losses due to current sensing. Installation of the system is easy, as catenary does not need to be isolated for the installation of sensors. In normal operation, trains are running in the railway line according to schedule, predetermined profile easily determines braking times and location.

According to a particular feature, the first or the second detector detects the absence or the presence by receiving messages from a server.

Thus, the system requires no current or voltage sensing, and can be dynamically adapted to real driving conditions of trains both in normal and abnormal situations.

According to a particular feature, the first or the second detector detects the absence or the presence by receiving measured current values from substations which are connected to one section the substation is connected to and by calculating, for each section the substation is connected to, the difference between a current value sensed by the substation in the section to the received current value.

Thus, the sum of currents being consumed/injected by trains in a given section of catenary can be easily estimated by substations, using for example Kirchhoff law. This instant information is reliable and covers both normal and abnormal situations. Furthermore, it indicates the presence of a braking train in a section connected to the substation even when the substation is still injecting current to that section. Such situation can not be detected without cooperation between substations. As a result, the current squeezing of braking trains due to overvoltage imposed by surrounding substation is minimised, further reducing waste losses.

According to a particular feature, the first or the second detector is comprised in a server which receives measured current values from substations and calculates, for each section, the difference between current values sensed and transferred by substations connected to the section.

Thus, the information is centralised. Information is accurate and flexibility is also given to the server to prioritise energy consumption or delay recovery.

According to a particular feature, the first or the second detector is comprised in the substation.

Thus, the latency of decision is minimised. Information is more accurate.

According to a particular feature, the first detector is comprised in the substation and in a server and the electric power provided by the substation to the catenary is interrupted if the substation or the server detect presence of the braking train in one of the sections connected to the substation.

Thus, priority is given to the recovery of braking energy. If one means detects the presence of a braking train, the substation stops the delivery of power to the catenary. This may cause delay, but ensures that the substation doesn't feed energy to the catenary when it could have been supplied by the braking train.

According to a particular feature, the second detector is comprised in the substation and in the server and the electric power provided by the substation to the catenary is enabled if the substation and the server detect absence of braking trains in one of the sections connected to the substation.

Thus, priority is given to the recovery of braking energy. When only one means detects the absence of braking trains, a braking train may still be in a section connected to the substation. Enabling the delivery of power by the substation to the catenary may impose an overvoltage and undesired squeezing losses in the braking train.

The characteristics of the invention will emerge more clearly from a reading of the following description of example embodiments, the said description being produced with reference to the accompanying drawings.

BRIEF DESCRIPTION OF DRAWINGS

FIG. 1 represents an example of an electric railway system in which the present invention is implemented.

FIG. 2A represents an example of substation including an enabling/interrupting controller and an enabling/interrupting device according to the present invention.

FIG. 2B represents an example of substation including an enabling/interrupting controller and an enabling/interrupting device according to the present invention.

FIG. 2C represents an example of substation including an enabling/interrupting controller and an enabling/interrupting device according to the present invention.

FIG. 3 represents an example of the architecture of a substation enabling/interrupting controller according to the present invention.

FIG. 4 represents an example of the architecture of a server according to the present invention.

FIG. 5A represents an example of sensors of the substation enabling/interrupting controller according to the present invention.

FIG. 5B represents an example of sensors of the substation enabling/interrupting controller according to the present invention.

FIG. 6 represents an algorithm executed by a substation enabling/interrupting controller according to a first mode of realization of the present invention.

FIG. 7 represents an algorithm executed by a substation enabling/interrupting controller according to a second mode of realization of the present invention.

FIG. 8A represents an algorithm executed by a substation enabling/interrupting controller according to a third mode of realization of the present invention.

FIG. 8B represents an algorithm executed by a server according to the third and fourth modes of realization of the present invention.

FIG. 9 represents an algorithm executed by a substation enabling/interrupting controller according to a fourth mode of realization of the present invention.

DESCRIPTION OF EMBODIMENTS

FIG. 1 represents an example of an electric railway system in which the present invention is implemented.

The electric railway system comprises a plurality of substations noted ST1 to ST4, trains noted T1 to T4, railway RA and catenary CA.

Each substation ST provides electric power to trains T through catenary CA and railway.

The substations ST1 to ST4 may be, according to the second mode of realization of the present invention, connected to each other through a communication network NT.

The substations ST1 to ST4 may be, according to the third and fourth modes of realization of the present invention, connected to each other through a communication network NT and to a server Serv.

The railway and the catenary are divised into sections S01, S12, S23, S34 and S45 in order to simplify the understanding of the present invention.

The section S01 comprises the railway and the catenary between the substation ST1 and another substation not shown in FIG. 1.

The section S12 comprises the railway and the catenary between the substations ST1 and ST2 which are neighbour substations ST.

The section S23 comprises the railway and the catenary between the substations ST2 and ST3 which are neighbour substations ST.

The section S34 comprises the railway and the catenary between the substations ST3 and ST4 which are neighbour substations ST.

The train T1 is located in the section S12. The train T2 is located in the section S23 and the trains T3 and T4 are located in the section S34.

The section S45 comprises the railway and the catenary between the substation ST4 and another substation not shown in FIG. 1.

FIGS. 2A to 2C represent examples of substation including the enabling/interrupting controller and enabling/interrupting device according to the present invention.

The substation ST is connected to the grid GR and to the catenary CA and rail RA. AC voltage, for example 25 kV, from the Grid GR is downsized through at least one transformer TR, converted into DC voltage, for example 1.5 kV, through rectifier RE, and filtered through filter FL prior to being delivered between rail and catenary.

According to the invention, the substation further comprises a enabling/interrupting controller EIC and a enabling/interrupting device EID.

The FIG. 2A represents a first example of substation including the enabling/interrupting controller and enabling/interrupting device according to the present invention.

According to FIG. 2A, the enabling/interrupting device EIDa is located between transformer TR and rectifier RE, and comprises at least one AC current breaker per phase. Upon decision by the enabling/interrupting controller EIC to disconnect the substation from the catenary, the current breakers are operated to turn-off at the time the voltage or the current of the corresponding phase crosses zero. Upon decision by the enabling/interrupting controller EIC to reconnect the substation ST to the catenary CA, the current breakers per phase are operated to turn-on at the time the voltage or the current of the corresponding phase crosses zero.

The current breakers per phase may consist in a thyristor, an IGBT, a mechanical relay, a or a controllable breaker.

The FIG. 2B represents a second example of substation including the enabling/interrupting controller and enabling/interrupting device according to the present invention.

According to the example of FIG. 2B, the enabling/interrupting device EIDb consists in one DC current breaker, which is connected in series between the rectifier RE and the filter FL. Upon decision by the enabling/interrupting controller EIC to disconnect the substation ST from the catenary CA, the current breaker is operated to turn-off. Upon decision by the enabling/interrupting controller EIC to reconnect the substation ST from the catenary CA, the current breaker is operated to turn-on.

The current breaker consists in a power switch (as example a thyristor, an IGBT, a MOSFET), a mechanical relay, a or a controllable breaker. In a preferred realisation of invention, the current breaker consists in a power switch, and during the turn-on and turn-off transients, the di/dt speed of the power switch is controlled using a high gate resistance in order to limit voltage overshoot at filter FL capacity.

The FIG. 2C represents a third example of substation including the enabling/interrupting controller and enabling/interrupting device according to the present invention.

The rectifier RE is implemented as a controllable power converter EIDc. The controllable power converter EIDc performs the voltage conversion from AC to DC, but can also be operated to control the amount of current injected to the catenary CA. Upon decision by the enabling/interrupting controller EIC to disconnect the substation ST from the catenary CA, the current delivered by the controllable power converter EIDc is smoothly steered to zero. Then power switches of controllable power converter EIDc remain open. Upon decision by the enabling/interrupting controller EIC to reconnect the substation ST to the catenary CA, the voltage delivered by the controllable power converter EIDc is smoothly steered to the nominal catenary voltage.

The present invention also applies in a variant of the invention not depicted in FIGS. 2A to 2C, where substation ST feeds the catenary with an AC voltage. The rectifier is replaced by an AC/AC converter or omitted.

FIG. 3 represents an example of the architecture of a substation enabling/interrupting controller according to the present invention.

The substation enabling/interrupting controller EIC may be included in each substation ST.

The substation enabling/interrupting controller EIC has, for example, an architecture based on components connected together by a bus 301 and a processor 300 controlled by a program as disclosed in FIG. 6 or 7 or 8A or 9.

The bus 301 links the processor 300 to a read only memory ROM 302, a random access memory RAM 303, a detector 305, a Enabling/Interrupting Interface EII 306 and a communication interface 307.

The memory 303 contains registers intended to receive variables and the instructions of the program related to the algorithm as disclosed in FIG. 6 or 7 or 8A or 9. In a variant of invention, the memory 303 may contain a profile which indicates the presence and/or absence of neighbour braking trains over time. The processor 300 may store in memory 303 profiles received through the communication interface 207.

The read-only memory, or possibly a Flash memory 302 contains instructions of the program related to the algorithm as disclosed in FIG. 6 or 7 or 8A or 9, when the substation enabling/interrupting controller EIC is powered on, to the random access memory 303.

The detector 305 consists in sensors of currents, voltage and/or time. As example, the detector 305 senses the current that is delivered by the substation ST to the catenary CA.

As another example, the detector 305 senses the current flowing through the catenary CA at both sides of the point where substation ST injects current to the catenary CA.

As another example, the detector 305 senses the voltage of catenary CA at the point where substation ST injects current to the catenary CA.

As another example, the detector 305 senses the voltage and/or the current of each phase provided by the transformer TR of substation ST in FIG. 2A.

As yet another example, the detector 305 comprises a clock which measures the time. Detector 305 converts the sensed information into digital form and sends this sensed information to processor 300 through the bus 301.

The Enabling/Interrupting Interface 306 consists in means for controlling the Enabling/Interrupting Device EIC in order to connect/disconnect the substation ST to/from the catenary CA.

The network interface 307 may enable exchange of messages between the substation enabling/interrupting controller EIC and enabling/interrupting controllers EICs controlling neighbour substations and/or the server Serv.

The substation enabling/interrupting controller EIC may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the substation enabling/interrupting controller EIC includes circuitry, or a device including circuitry, causing the substation enabling/interrupting controller EIC to perform the program related to the algorithm as disclosed in FIG. 6 or 7 or 8A or 9.

FIG. 4 represents an example of the architecture of a server according to the present invention.

The server Serv has, for example, an architecture based on components connected together by a bus 401 and a processor 400 controlled by a program as disclosed in FIG. 8B.

The bus 401 links the processor 400 to a read only memory ROM 402, a random access memory RAM 403 and a communication interface 407.

The memory 403 contains registers intended to receive variables and the instructions of the program related to the algorithm as disclosed in FIG. 8B.

The read-only memory, or possibly a Flash memory 402 contains instructions of the program related to the algorithm as disclosed in FIG. 8B, when the server Serv is powered on, to the random access memory 403.

The network interface 407 may enable exchange of messages with substation enabling/interrupting controllers EIC.

The server Serv may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the server Serv includes circuitry, or a device including circuitry, causing the server Serv to perform the program related to the algorithm as disclosed in FIG. 8B.

FIGS. 5A and 5B represent examples of sensors of the substation enabling/interrupting controller according to the present invention.

The substation ST injects current in the catenary CA at injection point P, and the injected current is returned through rail RA.

FIG. 5A represents the location of sensors comprised in the detector 305 of the substation enabling/interrupting controller EIC according to a mode of realization of the present invention. Currents sensors 501 and 502 sense the current flowing through the catenary CA at both sides of injection point P, where substation ST injects current in the catenary CA.

In a variant, the detector 305 further comprises a voltage sensor 503, which measure the catenary voltage at injection point P, where substation ST injects current in the catenary CA. When voltage sensed by sensor 503 gets below a predetermined threshold, the processor 300 can determine the absence of surrounding braking trains.

Though not depicted in FIG. 5A, the substation ST may serve more than one rail track, and more than one catenary, according to the invention. For each catenary CA served by the substation ST, the detector 305 comprises a pair of sensors 501 and 502.

FIG. 5B represents the location of current sensors comprised in the detector 305 of the substation enabling/interrupting controller EIC according to an other mode of realization of the present invention.

Currents sensor 501 senses the current flowing through the catenary CA at one side of injection point P, where substation ST injects current in the catenary CA. Current sensor 504 senses the current injected by the substation ST in the catenary CA. Using currents sensed by sensors 501 and 504, the processor 300 can determine the current flowing through the catenary CA at the other side of injection point P, as being the difference between the currents sensed by sensors 501 and 504.

Currents flowing through both sides of catenary CA in the same direction indicate that one first side is actually providing current to the second side, and thus indicates the presence of a train braking in the vicinity of the substation ST.

FIG. 6 represents an algorithm executed by a substation enabling/interrupting controller EIC according to a first mode of realization of the present invention.

More precisely, the present algorithm is executed by the processor 300 of each substation enabling/interrupting controller EIC.

At step S60, the processor 300 checks if a braking train is present in one of the sections between the substation ST controlled by the substation enabling/interrupting controller EIC and its neighbouring substations ST.

For example, the processor 300 determines the presence of a neighbour braking train by comparing the direction of currents flowing through both sides of catenary CA. The currents flowing through both sides of catenary CA are sensed by the detector 305 or determined by difference of injected current and current flowing through one side of the catenary CA sensed by detector 305. When currents flowing through both sides of catenary CA flow in same direction, the processor 300 determines the presence of a neighbour braking train.

For example, in another variant of invention, the processor 300 determines the presence of a neighbour braking train comparing the time measured by detector 305 and a predetermined profile contained in RAM memory 303. When the predetermined profile indicates the presence of a neighbour braking train at measured time, the processor 300 determines the presence of a neighbour braking train.

For example, in another variant of invention, the processor 300 determines the presence of a neighbour braking train when receiving through the communication interface 307 a message indicating the presence of a neighbour braking train.

When the substation ST is also delivering current to a second train, then the substation ST imposes a high voltage to the catenary, causing even higher catenary voltage at the pantograph of the neighbour braking train. In such conditions, the neighbour braking train mode is likely squeezing part of its regenerated power, causing undesired energy losses.

If the processor 300 determines the presence of a neighbour braking train, the processor moves to step S61. Otherwise, the processor 300 returns to step S60.

At step S61, the processor 300 commands the connect/disconnect interface 306 in order to activate the means for enabling/interrupting device ETD in the state where no electric power from the grid is provided by the substation to the catenary.

At next step S62, the processor 300 checks if it is time to activate the means for enabling/interrupting device EID in the state where electric power from the grid is provided by the substation to the catenary.

For example, the processor 300 determines that it is time to activate the means for enabling/interrupting device EID in the state where electric power from the grid is provided by the substation to the catenary if the time elapsed since the leaving from step S61 is upper than a predetermined value.

For example, the processor 300 determines that it is time to activate the means for enabling/interrupting device EID in the state where electric power from the grid is provided by the substation to the catenary if the catenary voltage at the connection between the substation and the catenary, sensed by the voltage sensor 503 in the detector 305, gets below a predefined value. The catenary voltage being low, one train at least is in low voltage squeezing, and required acceleration current is low. This indicates the lack of supply current to the accelerating train, which may be caused by the absence of braking trains in both sections.

For example, the processor 300 determines that it is time to activate the means for enabling/interrupting device EID in the state where electric power from the grid is provided by the substation to the catenary by sensing the current flowing through one of the section if the sensed current is below a predefined value. This indicates that a surrounding train previously braking is gradually stopping its regeneration, and that squeezing losses due to hiding effect would remain marginal if substation would be re-connected.

For example, the processor 300 determines that it is time to activate the means for enabling/interrupting device EID in the state where electric power from the grid is provided by the substation to the catenary by comparing the time sensed by detector 305 and profile stored in memory 303. If profile stored in memory 303 indicates the absence of neighbour braking trains at sensed time, the processor determines that is time to activate the means for enabling/interrupting device EID in the state where electric power from the grid is provided by the substation to the catenary. For example, the processor 300 determines that it is time to activate the means for enabling/interrupting device EID in the state where electric power from the grid is provided by the substation to the catenary when receiving through communication interface 307 a message indicating the absence of a neighbour braking train.

If it is time to activate the means for enabling/interrupting device EID in the state where electric power from the grid is provided by the substation to the catenary, the processor 300 moves to step S63. Otherwise, the processor 300 returns to step S62.

At step S63, the processor 300 commands the enabling/interrupting interface 306 in order to activate the means for enabling/interrupting device EID in the state where electric power from the grid is provided by the substation to the catenary.

Then the processor 300 returns to step S60.

FIG. 7 represents an algorithm executed by a substation enabling/interrupting controller according to a second mode of realization of the present invention.

More precisely, the present algorithm is executed by the processor 300 of each substation enabling/interrupting controller.

At step S70, the processor 300 determines a first current flowing in a first section of catenary CA and a second current flowing in a second section of catenary CA.

As example, first and second currents are sensed by detector 305. According to the example of FIG. 1, the current flowing through sections S12 and S23 are sensed by the detector 305 of the substation ST2, the current flowing through sections S23 and S34 are sensed by the detector of the substation ST3.

As other example, first current and current injected by substation to the catenary CA are sensed by detector 305 and the processor 300 determines the second current as the difference between first current and current injected by substation to the catenary.

At next step S71, the processor 300 commands the network interface 307 to transfer a message to substation enabling/interrupting controllers EIC controlling neighbouring substations, the message comprising the sensed current values.

According to the example of FIG. 1, the message is sent by the substation enabling/interrupting controller EIC of the substation ST2 to the substation enabling/interrupting controllers EIC of substations ST1 and ST3.

At next step S72, the processor 300 receives through the network interface 307 a message from substation enabling/interrupting controllers EIC controlling neighbouring substations, each message comprising sensed current values by the detector 305 of the neighbour substation.

According to the example of FIG. 1, the substation ST2 receives a message from the substation ST1, which comprises sensed current values of sections S01 and S12 and a message from the substation ST3, which comprises sensed current values of sections S23 and S34.

At next step S73, the processor 300 checks if a braking train is in one of the sections between the substation and its neighbour substations ST.

For example, the processor 300 calculates, for each section, the difference between the current sensed at step S70 and the current received from the neighbour substation for the section. If the difference is upper than a predetermined positive value, then at least one train in the section provides power to the catenary i.e. a braking train is located in the section.

If a braking train is in one of the sections between the substation ST and its neighbouring substations ST, the processor 300 moves to step S74. Otherwise, the processor 300 returns to step S73.

At step S74, the processor 300 commands the connect/disconnect interface 306 in order to activate the means for enabling/interrupting device EID in the state where no electric power from the grid is provided by the substation to the catenary.

At next step S75, the processor 300 checks if it is time to activate the means for enabling/interrupting device EID in the state where electric power from the grid is provided by the substation to the catenary, i.e. providing electric power to the catenary.

For example, the processor 300 determines that it is time to activate the means for enabling/interrupting device EID in the state where electric power from the grid is provided by the substation to the catenary if the time elapsed the stop of providing electric power to the catenary and current time is upper than a predetermined value.

For example, the processor 300 determines that it is time to activate the means for enabling/interrupting device EID in the state where electric power from the grid is provided by the substation to the catenary by sensing currents flowing through scontions as disclosed at step S70, by transferring messages to neighbour substations as disclosed at step S71, by receiving messages from neighbour substations as disclosed at step S72 and by calculating, for each section as disclosed at step S72, the difference between the current sensed at the substation and the current received from the neighbour substation for the section. If the difference is lower than a negative predetermined value, then the section comprises more power loads, such as accelerating trains than power sources, such as braking trains, and it can be considered that braking trains would not be hidden by the substation, as power can flow directly from braking trains to accelerating trains within the section.

If it is time to activate the means for enabling/interrupting device EID in the state where electric power from the grid is provided by the substation to the catenary, the processor 300 moves to step S76. Otherwise, the processor 300 returns to step S75.

At step S76, the processor 300 commands the enabling/interrupting interface 306 in order to activate the means for enabling/interrupting device EID in the state where electric power from the grid is provided by the substation to the catenary.

FIG. 8A represents an algorithm executed by a substation enabling/interrupting controller according to a third and fourth modes of realization of the present invention.

More precisely, the present algorithm is executed by the processor 300 of each substation enabling/interrupting controller.

At step S800, the processor 300 determines a first current flowing in a first section of catenary CA and a second current flowing in a second section of catenary CA, as disclosed in step S70.

At next step S801, the processor 300 commands the network interface 307 to transfer a message to server Serv, the message comprising the determined current values.

At next step S802, the processor 300 checks if a message is received through network interface 307 from server Serv indicating that no electric power from the grid GR has to be provided by the substation ST to the catenary CA.

If a message indicating that no electric power from the grid GR has to be provided by the substation ST to the catenary CA is received, the processor 300 moves to step S803. Otherwise, the processor 300 moves to step S804.

At step S803, the processor 300 commands the enabling/interrupting interface EII 306 in order to activate the means for enabling/interrupting device EID in the state where no electric power from the grid GR is provided by the substation ST to the catenary CA.

At next step S804, the processor 300 checks if a message is received through network interface 307 from server Serv indicating that electric power from the grid GR has to be provided by the substation ST to the catenary CA.

If a message indicating that electric power from the grid GR has to be provided by the substation ST to the catenary CA is received, the processor 300 moves to step S805. Otherwise, the processor 300 moves to step S800.

At step S805, the processor 300 commands the enabling/interrupting interface EII 306 in order to activate the means for enabling/interrupting device EID in the state where electric power from the grid GR is provided by the substation ST to the catenary CA.

FIG. 8B represents an algorithm executed by a server according to the third and fourth mode of realization of the present invention.

More precisely, the present algorithm is executed by the processor 400 of the server Serv.

At step S850, the processor 400 receives through the network interface 407 a message from the enabling/interrupting controllers EIC of each substation ST, each message comprising sensed current values by the substation detector 305 of each substation ST as disclosed at step S800 of FIG. 8A.

At next step S851, the processor 400, for each substation ST, checks if a braking train is in one of the sections between the substation ST and its neighbour substations ST.

For example, the processor 300 calculates, for each substation ST and each section, the difference between the current value received at step S850 from the substation ST and the current received from the neighbour substation ST for the section. If the difference is upper than a predetermined value, then at least one train in the section ST provides power to another train in the other sections, i.e. a braking train is in the section.

For example, the processor 400 determines for each substation ST if a braking train is in one of the sections between the substation and its neighbour substations ST according to a connection time table. The connection table is determined according to likely acceleration and deceleration times of passing trains, according to driving profile and timetable of trains. The disconnection and reconnection procedure is deterministic and visible to all train drivers. The connection table is determined measurement of squeezing power in absence of disconnection.

If no braking train is in one of the sections, the processor 400 moves to step S853. If a braking train is in one of the sections of at least one substation ST, the processor 400 moves to step S852.

At step S852, the processor commands the transfer of a message to each substation ST of which a braking train is in one of the sections of the substation. The message indicates that no electric power from the grid GR has to be provided by the substation ST to the catenary CA.

At next step S853, the processor 400, for each substation ST, checks if no braking train is in one of the sections between the substation ST and its neighbouring substations ST.

For example, the processor 400 calculates, for each substation ST and each section, the difference between the current value received at step S850 from the substation ST and the current received from the neighbour substation ST for the section. If the difference is lower than a predetermined value, then no train in the section provides power to another train in the other section, i.e. no braking train is in the section.

For example, the processor 400 determines for each substation ST, checks if a braking train is in one of the sections between the substation and its neighbour substations ST according to a connection time table. The connection table is determined according to likely acceleration and deceleration times of passing trains, according to driving profile and timetable of trains. The disconnection and reconnection procedure is deterministic and visible to all train drivers. The connection table is determined measurement of squeezing power in absence of disconnection.

If no braking train is in one of the sections, the processor 400 moves to step S853. If a braking train is in one of the sections of at least one substation ST, the processor 400 moves to step S852.

If no braking train is in one of the sections, the processor 400 moves to step S851. If no braking train is in one of the sections of at least one substation ST, the processor 400 moves to step S854.

At step S854, the processor commands the transfer of a message to each substation ST of which no braking train is in one of the sections of the substation ST. The message indicates that electric power from the grid GR has to be provided by the substation ST to the catenary CA.

FIG. 9 represents an algorithm executed by a substation connection and disconnection controller according to the fourth of realization of the present invention.

More precisely, the present algorithm is executed by the processor 300 of each substation enabling/interrupting controller EIC.

At step S900, the processor 300 determines a first current flowing in a first section of the catenary CA and a second current flowing in a second section of the catenary CA as disclosed at step S70 of FIG. 7.

At next step S901, the processor 300 commands the network interface 307 to transfer a message to server Serv, the message comprising the current values determined at step S900.

At step S902, the processor 300 checks if a braking train is present in one of the sections between the substation ST controlled by the substation enabling/interrupting controller EIC and its neighbour substations ST.

For example, the processor 300 determines the presence of a neighbour braking train by comparing the direction of currents flowing through both sides of catenary CA. The currents flowing through both sides of catenary CA are sensed by the detector 305 or determined by difference of injected current and current flowing through one side of the catenary CA sensed by detector 305. When currents flowing through both sides of catenary CA flow in same direction, the processor 300 determines the presence of a neighbour braking train.

For example, in another variant of invention, the processor 300 determines the presence of a neighbour braking train comparing the time measured by detector 305 and a predetermined profile contained in RAM memory 303. When the predetermined profile indicates the presence of a neighbour braking train at measured time, the processor 300 determines the presence of a neighbour braking train.

For example, in another variant of invention, the processor 300 determines the presence of a neighbour braking train when receiving through the communication interface 307 a message indicating the presence of a neighbour braking train.

When the substation ST is also delivering current to a second train, then the substation ST imposes a high voltage to the catenary, causing even higher catenary voltage at the pantograph of the neighbour braking train. In such conditions, the neighbour braking train mode is likely squeezing part of its regenerated power, causing undesired energy losses.

If the processor 300 determines the presence of a neighbour braking train, the processor moves to step S904. Otherwise, the processor 300 moves to step S903.

At step S903, the processor 300 checks if a message is received through network interface 307 from server Serv indicating that no electric power from the grid GR has to be provided by the substation ST to the catenary CA.

If a message indicating that no electric power from the grid GR has to be provided by the substation ST to the catenary CA is received, the processor 300 moves to step S904. Otherwise, the processor 300 moves to step S905.

At step S904, the processor 300 commands the enabling/interrupting interface EII 306 in order to activate the means for enabling/interrupting device EID in the state where no electric power from the grid GR is provided by the substation ST to the catenary CA.

At next step S905, the processor 300 checks if it is time to activate the means for enabling/interrupting device EID in the state where electric power from the grid GR is provided by the substation ST to the catenary CA.

For example, the processor 300 determines that it is time to activate the means for enabling/interrupting device EID in the state where electric power from the grid is provided by the substation to the catenary if the time elapsed since the leaving from step S904 is upper than a predetermined value.

For example, the processor 300 determines that it is time to activate the means for enabling/interrupting device EID in the state where electric power from the grid is provided by the substation to the catenary if the catenary voltage at the connection between the substation and the catenary, sensed by the voltage sensor 503 in the detector 305, gets below a predefined value. The catenary voltage being low, one train at least is in low voltage squeezing, and required acceleration current is low. This indicates the lack of supply current to the accelerating train, which may be caused by the absence of braking trains in both sections.

For example, the processor 300 determines that it is time to activate the means for enabling/interrupting device EID in the state where electric power from the grid is provided by the substation to the catenary by sensing the current flowing through one of the section if the sensed current is below a predefined value. This indicates that surrounding train previously braking is gradually stopping its regeneration, and that squeezing losses due to hiding effect would remain marginal if substation would be re-connected.

For example, the processor 300 determines that it is time to activate the means for enabling/interrupting device EID in the state where electric power from the grid is provided by the substation to the catenary by comparing the time sensed by detector 305 and profile stored in memory 303. If profile stored in memory 303 indicates the absence of neighbour braking trains at sensed time, the processor determines that is time to activate the means for enabling/interrupting device EID in the state where electric power from the grid is provided by the substation to the catenary. For example, the processor 300 determines that it is time to activate the means for enabling/interrupting device EID in the state where electric power from the grid is provided by the substation to the catenary when receiving through communication interface 307 a message indicating the absence of a neighbour braking train.

If it is time to activate the means for enabling/interrupting device EID in the state where electric power from the grid is provided by the substation to the catenary, the processor 300 moves to step S906. Otherwise, the processor 300 returns to step S905.

At next step S906, the processor 300 checks if a message is received through network interface 307 from server Serv indicating that electric power from the grid has to be provided by the substation to the catenary.

If a message indicating that electric power from the grid has to be provided by the substation to the catenary is received, the processor 300 moves to step S907. Otherwise, the processor 300 returns to step S905.

At step S907, the processor 300 commands the enabling/interrupting interface 306 in order to activate the means for enabling/interrupting device EID in the state where electric power from the grid is provided by the substation to the catenary. After that, the processor 300 returns to step S900.

Naturally, many modifications can be made to the embodiments of the invention described above without departing from the scope of the present invention.

The invention claimed is:

1. A system for reducing the electric power consumption of a railway system comprising at least one catenary, trains and at least one substation connected to sections of catenary and providing electric power to the catenary, wherein during the braking of the trains, the braking trains provide electric power to the catenary, characterized in that the substation is associated to one device for reducing the electric power consumption, and in that the system comprises:
a first detector to detect the presence of a braking train in one of the section connected to the substation,
by sensing the current in each section connected to the substation and by checking if the currents flow in the same direction or
by comparing the current time to a predetermined profile indicating the presence of braking trains in the time
an interrupter to interrupt the electric power provided by the substation to the catenary if the presence of the braking train in one of the sections connected to the substation is detected,
a second detector to detect the absence of braking trains in each section connected to the substation,
means for enabling circuitry to enable the electric power to be provided by the substation to the catenary if the absence of braking trains in each section connected to the substation is detected and if the electric power provided by the substation is interrupted.

2. The system according to claim 1, wherein the first detector detects the presence by sensing the current in one section connected to the substation and by sensing the current provided by the substation to the catenary.

3. The system according to claim 1, wherein the first detector detects the presence by comparing the current time to a predetermined profile indicating the presence of braking trains in the time.

4. The system according to claim 1, wherein the second detector detects the absence by comparing the time elapsed since the interrupting of the electric power provided by the substation to the catenary to a predetermined value.

5. The system according to claim 1, wherein the second detector detects the absence by sensing the voltage at the connection of the catenary to the substation and by comparing the sensed voltage to a predetermined value.

6. The system according to claim 1, wherein the second detector detects the absence by sensing the current in one of the section connected to the substation and by comparing if the sensed current is lower than a predetermined value.

7. The system according to claim 1, wherein the second detector detects the absence by comparing the current time to a predetermined profile indicating the presence of braking trains in the time.

8. The system according to claim 1, wherein the first or the second detector detects the absence or the presence by receiving messages from a server.

9. The system according to claim 1, wherein the first or the second detector detects the absence or the presence by receiving measured current values from substations which are connected to one section the substation is connected to and by calculating, for each section the substation is connected to, the difference between a current value sensed by the substation in the section to the received current value.

10. The system according to claim 1, wherein the first or the second detector is comprised in a server which receives measured current values from substations and calculates, for each section, the difference between current values sensed and transferred by substations connected to the section.

11. The system according to claim 1, wherein the first or the second detector is comprised in the substation.

12. The system according to claim 1, wherein the first detector is comprised in the substation and in a server and the electric power provided by the substation to the catenary is interrupted if the substation or the server detect presence of the braking train in one of the sections connected to the substation.

13. The system according to claim 1, wherein the second detector is comprised in the substation and in a server and the electric power provided by the substation to the catenary is enabled if the substation and the server detect absence of braking trains in one of the sections connected to the substation.

14. A method for reducing the electric power consumption of a railway system comprising at least one catenary, trains and at least one substation connected to sections of catenary and providing electric power to the catenary, wherein during the braking of the trains, the braking trains provide electric power to the catenary, characterized in that the substation is associated to one device for reducing the electric power consumption, and in that the method comprises the step of:
  detecting the presence of a braking train in one of the section connected to the substation,
  interrupting the electric power provided by the substation to the catenary if the presence of the braking train in one of the sections connected to the substation is detected,
  detecting the absence of braking trains in each section connected to the substation,
  enabling the electric power to be provided by the substation to the catenary if the absence of braking trains in each section connected to the substation is detected and if the electric power provided by the substation is interrupted.

* * * * *